(12) United States Patent
Byeon

(10) Patent No.: US 8,699,280 B2
(45) Date of Patent: Apr. 15, 2014

(54) SEMICONDUCTOR APPARATUS AND DATA TRANSMISSION METHOD THEREOF

(75) Inventor: Sang Jin Byeon, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 162 days.

(21) Appl. No.: 13/339,062

(22) Filed: Dec. 28, 2011

(65) Prior Publication Data

US 2013/0051165 A1   Feb. 28, 2013

(30) Foreign Application Priority Data

Aug. 26, 2011  (KR) .................. 10-2011-0085677

(51) Int. Cl.
G11C 7/00   (2006.01)
G11C 7/10   (2006.01)
G11C 8/00   (2006.01)

(52) U.S. Cl.
USPC ............ 365/189.05; 365/189.17; 365/230.03; 365/230.06

(58) Field of Classification Search
USPC .................. 365/51, 63, 189.05, 189.17, 200, 365/230.03, 230.06, 52, 233.1
See application file for complete search history.

(56) References Cited

U.S. PATENT DOCUMENTS

| | | | | |
|---|---|---|---|---|
| 5,504,373 | A * | 4/1996 | Oh et al. | 365/52 |
| 6,046,957 | A * | 4/2000 | Shyu | 365/230.06 |
| 6,104,646 | A * | 8/2000 | Haga | 365/51 |
| 6,324,104 | B1 * | 11/2001 | Matsui | 365/200 |
| 6,594,818 | B2 * | 7/2003 | Kim et al. | 365/200 |
| 8,400,805 | B2 * | 3/2013 | Yoko | 365/51 |

FOREIGN PATENT DOCUMENTS

| | | |
|---|---|---|
| JP | 2007-004967 A | 1/2007 |
| KR | 1020090070122 A | 1/2009 |

* cited by examiner

*Primary Examiner* — Trong Phan
(74) *Attorney, Agent, or Firm* — William Park & Associates Patent Ltd.

(57) ABSTRACT

A semiconductor apparatus includes a normal data line, an auxiliary data line and a data line selection unit. The normal data line is connected with a data selection unit. The auxiliary data line is connected with the data selection unit. The data line selection unit outputs data to one of the normal data line and the auxiliary data line in response to a command signal.

17 Claims, 4 Drawing Sheets

US 8,699,280 B2

SEMICONDUCTOR APPARATUS AND DATA TRANSMISSION METHOD THEREOF

CROSS-REFERENCES TO RELATED APPLICATION

The present application claims priority under 35 U.S.C. §119(a) to Korean application number 10-2011-0085677, filed on Aug. 26, 2011, in the Korean Intellectual Property Office, which is incorporated herein by reference in its entirety as set forth in full.

BACKGROUND

1. Technical Field

The present invention relates to a semiconductor apparatus, and more particularly, to a 3D (three-dimensional) semiconductor apparatus and a data transmission method thereof.

2. Related Art

In order to improve the degree of integration of a semiconductor apparatus a 3D (three-dimensional) semiconductor apparatus has been developed. The 3D semiconductor apparatus typically includes a plurality of chips that are stacked and packaged to increase the degree of integration. In the 3D semiconductor apparatus, since two or more chips are vertically stacked, a maximum degree of integration may be achieved in a same area.

Various methods may be applied to realize the 3D semiconductor apparatus. In one of the methods, a plurality of chips having a same structure are stacked and then the plurality of chips are connected with one another using wires such as metal lines so that the plurality of chips operate as one semiconductor apparatus.

Recently, a TSV (through-silicon via) type semiconductor apparatus has been disclosed in the art, in which through-silicon vias are formed to pass through a plurality of stacked chips so that all the chips are electrically connected with one another. In the TSV type semiconductor apparatus, because the through-silicon vias vertically pass through respective chips to electrically connect them with one another, the area of a package may be efficiently reduced when compared to a semiconductor apparatus in which respective chips are connected with one another through peripheral wiring.

A plurality of chips constituting the 3D semiconductor apparatus typically operates by being divided into a plurality of is physical ranks or logical ranks. That is to say, a configuration is made such that a rank, selected in response to a chip select command or an address, performs a data read or write operation. The plurality of ranks each shares a data input/output lines and data pads. The data input/output lines are connected with one another by through-silicon vias which pass through the plurality of chips, and communicate with an external controller through shared channels connected with shared data pads which may be disposed in a master chip.

In a typical semiconductor apparatus, since data input lines and data output lines are commonly used, read and write operations are performed with a predetermined time interval so as to avoid collision. In the case of the 3D semiconductor apparatus described above, because the physical or logical ranks may independently perform read and write operations, the read and write operations may be performed with the predetermined time interval not secured before read or write operations. Since continuous read and write operations for the same rank are performed with the predetermined time interval, no problem is caused. However, when a read or write operation is performed for a first rank immediately after a read or write operation is performed for a second rank, data collision is likely to occur. In particular, in the case where a read operation is performed for the second rank immediately after a write operation is performed for the first rank, the probability of data collision increases.

SUMMARY

A semiconductor apparatus which has an auxiliary data line and can prevent collision of data in continuous write and read operations and a data transmission method thereof are described herein.

In one embodiment of the present invention, a semiconductor apparatus includes: a normal data line connected with a data line selection unit; an auxiliary data line connected with the data line selection unit; and the data line selection unit configured to output data to one of the normal data line and the auxiliary data line in response to a command signal.

In another embodiment of the present invention, a semiconductor memory apparatus including a plurality of chips stacked upon one another includes: a normal data line shared by the plurality of chips for transmitting data; an auxiliary data line shared by the plurality of chips for transmitting the data; and data line selection units disposed in the respective chips and configured to output the data to one of the normal data line and the auxiliary data line in response to a command signal.

In another embodiment of the present invention, a data transmission method of a semiconductor apparatus including a first chip and a second chip which share a normal data line and an auxiliary data line includes: transmitting write data to the first chip through the normal data line in response to a write command for the first chip; determining whether or not a read command for the second chip is inputted within a predetermined time after the write command for the first chip is inputted; and outputting read data to one of the normal data line and the auxiliary data line depending upon a determination result.

In another embodiment of the present invention, a data transmission method of a semiconductor apparatus including a plurality of chips which operate by being divided into a plurality of ranks comprising at least a first and second rank and share a normal data line and an auxiliary data line includes: transmitting write data to one rank through the normal data line in response to a write command for the one rank; determining whether or not a read command for another rank is inputted within a predetermined time after the write command for the one rank is inputted; and outputting read data of the another rank to one of the normal data line and the auxiliary data line depending upon a determination result.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a data transmission method thereof according to embodiment of the present invention will be described below with reference to the accompanying drawings through example embodiments.

Figure 1:
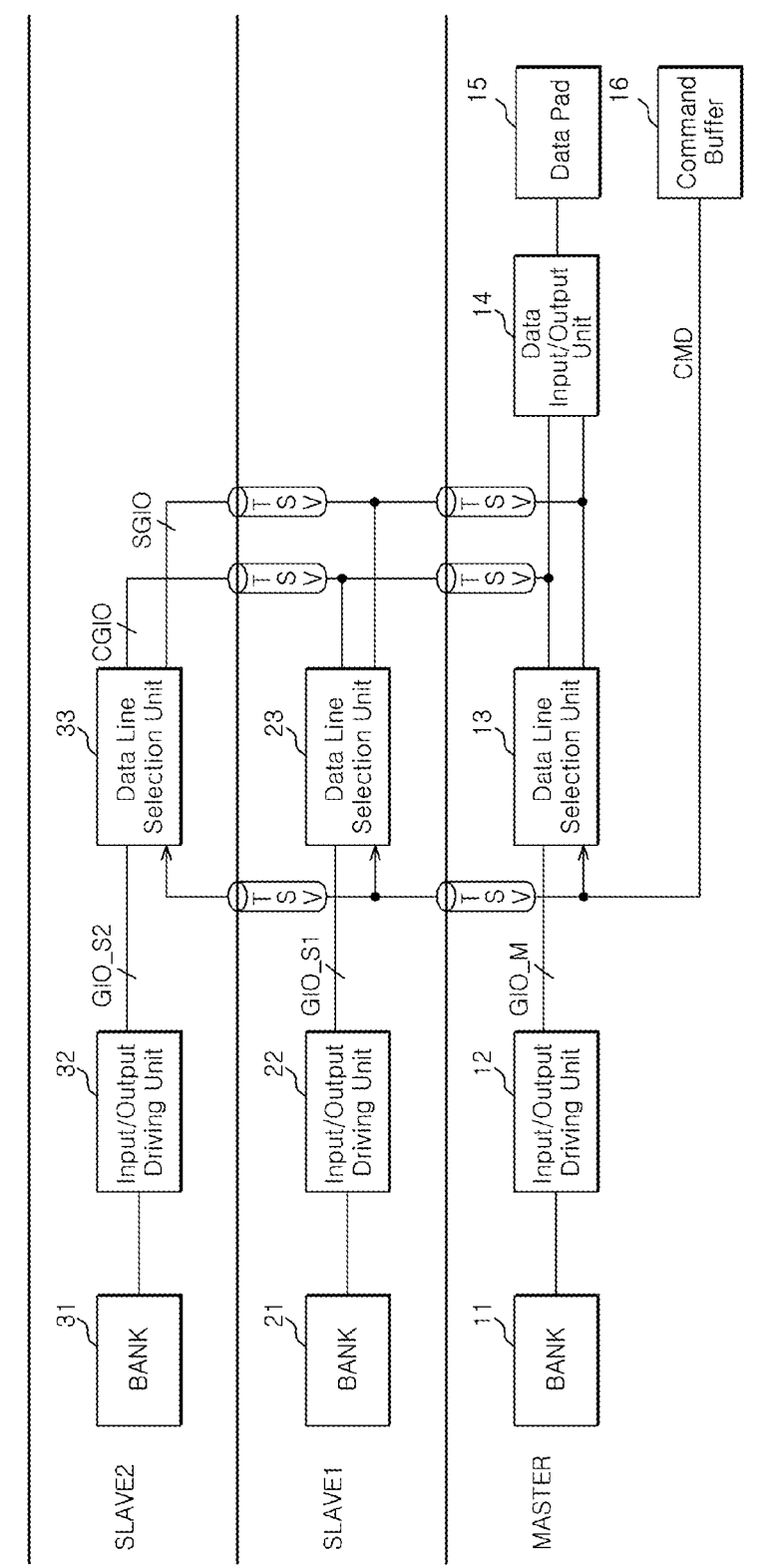
FIG. 1 is a view schematically showing a configuration of a semiconductor apparatus in accordance with an embodiment of the present invention.

FIG. 1 is a view schematically showing a configuration of a semiconductor apparatus 1 in accordance with an embodiment of the present invention. While it is exemplified in FIG. 1 that three chips are stacked, it is to be noted that the number of stacked chips is not specifically limited. In the semiconductor apparatus 1, it is exemplified that a lowermost positioned chip corresponds to a master chip MASTER and chips stacked on the master chip MASTER correspond to slave chips SLAVE1 and SLAVE2. The semiconductor apparatus 1, in which the roles of the master chip MASTER and the slave chips SLAVE1 and SLAVE2 are divided, may communicate with an external controller through the master chip MASTER. Therefore, the stacked chips MASTER, SLAVE1 and SLAVE2 are structured to share data lines and data pads.

In FIG. 1, the slave chips SLAVE1 and SLAVE2 include memory banks 21 and 31, input/output driving units 22 and 32, and data line selection units 23 and 33. While the master chip MASTER is exemplified as including a memory bank 11, an input/output driving unit 12, and a data line selection unit 13, similar to the slave chips SLAVE1 and SLAVE2, the master chip MASTER may include other component elements depending upon an application. The memory banks 11, 21 and 31 include a plurality of memory cell arrays in which data are stored. The input/output driving units 12, 22 and 32 store the data transmitted through data lines GIO_M, GIO_S1 and GIO_S2 of the respective chips MASTER, SLAVE1 and SLAVE2 in the memory banks 11, 21 and 31. The input/output driving units 12, 22 and 32 may also output the data stored in the memory banks 11, 21 and 31 to the data lines GIO_M, GIO_S1 and GIO_S2.

In FIG. 1, the data lines GIO_M, GIO_S1 and GIO_S2 of the respective chips MASTER, SLAVE1 and SLAVE2 are commonly connected with a normal data line CGIO and an auxiliary data line SGIO. The normal data line CGIO is commonly connected with the data lines GIO_M, GIO_S1 and GIO_S2 of the respective chips MASTER, SLAVE1 and SLAVE2, and may transmit the data outputted from the respective chips MASTER, SLAVE1 and SLAVE2 to a data pad 15. The normal data line CGIO may also transmit the data inputted through the data pad 15 to the respective chips MASTER, SLAVE1 and SLAVE2. The auxiliary data line SGIO may comprise a same number lines as the normal data lines CGIO. Similar to the normal data line CGIO, the auxiliary data line SGIO is commonly connected with the data lines GIO_M, GIO_S1 and GIO_S2 of the respective chips MASTER, SLAVE1 and SLAVE2. Since the normal data line CGIO and the auxiliary data line SGIO are commonly connected with the data lines GIO_M, GIO_S1 and GIO_S2 of the respective chips MASTER, SLAVE1 and SLAVE2, the normal data line CGIO and the auxiliary data line SGIO connect the memory banks 11, 21 and 31 of the respective chips MASTER, SLAVE1 and SLAVE2 with the data pad 15. Accordingly, the normal data line CGIO and the auxiliary data line SGIO are shared by the master chip MASTER and the slave chips SLAVE1 and SLAVE2, and are provided for transmission of data of the master chip MASTER and the slave chips SLAVE1 and SLAVE2. In FIG. 1, it is exemplified that the normal data line CGIO and the auxiliary data line SGIO may be constituted by through-silicon vias TSVs which pass through and connect the master chip MASTER and the slave chips SLAVE1 and SLAVE2.

The master chip MASTER further includes a data input/output unit 14 and the data pad 15. The data input/output unit 14 is configured to buffer external data inputted through the data pad 15 and transmits the buffered external data to the normal data line CGIO or the auxiliary data line SGIO in a write operation. The data input/output unit 14 may also be configured to buffer the data transmitted through the normal data line CGIO or the auxiliary data line SGIO and output the buffered data to the data pad 15 in a read operation. The data pad 15 is a channel which connects the is semiconductor apparatus 1 with the external controller.

The data line selection units 13, 23 and 33 may be disposed in the respective chips MASTER, SLAVE1 and SLAVE2. The data line selection units 13, 23 and 33 are configured to output data (in particular, the data stored in the memory banks 11, 21 and 31 in the read operation) to one of the normal data line CGIO and the auxiliary data line SGIO in response to a command signal CMD. The command signal CMD may be inputted through a command buffer 16 and includes a write command WT and a read command RD. The command signal CMD may be transmitted to the MASTER, SLAVE1 and SLAVE2 chips, for example, through through-silicon vias TSVs.

The data line selection units 13, 23 and 33 determine whether or not the read command RD is inputted within a predetermined time (that is, less than or equal to a predetermined time) after the write command WT is inputted and output the data to one of the normal data line CGIO and the auxiliary data line SGIO depending upon a determination result. When the read command RD is inputted after the predetermined time after the write command WT is inputted, the data line selection units 13, 23 and 33 output the data to the normal data line CGIO. When the read command RD is inputted within the predetermined time after the write command WT is inputted, the data line selection units 13, 23 and 33 output the data to the auxiliary data line SGIO. The predetermined time means a time after which the read command RD may be inputted after the write command WT is inputted. Since a great number of data lines are disposed in a is semiconductor apparatus, the data lines are commonly used for data transmission in a write operation and a read operation. Thus, if the write and read operations are continuously performed within the predetermined time, write data and read data are likely to collide with each other. In order to prevent the occurrence of such collisions, in a semiconductor apparatus, a write to read time (tWTR) is prescribed to allow control to be implemented such that the read command RD can be inputted after the lapse of the predetermined time after the write command WT is inputted. However, when a semiconductor apparatus in which a plurality of chips sharing data lines are stacked, since the read command RD may be inputted to a first chip within tWTR after the write command WT is inputted to a second chip, the probability of data collision increases as aforementioned above. Therefore, the semiconductor apparatus 1 in accordance with an embodiment of the present invention is configured to include the data line selection units 13, 23 and 33 and the auxiliary data line SGIO such that, when the read command RD is inputted within the predetermined time after the write command WT is inputted, the data outputted from the memory banks 11, 21 and 31 are outputted not to the normal data line CGIO but to the auxiliary data line SGIO. Hence, since read data according to the performance of the read operation are outputted to the auxiliary data line SGIO, the read data may be normally outputted while being prevented from colliding with write data which are transmitted through the normal data line SGIO.

Figure 2:
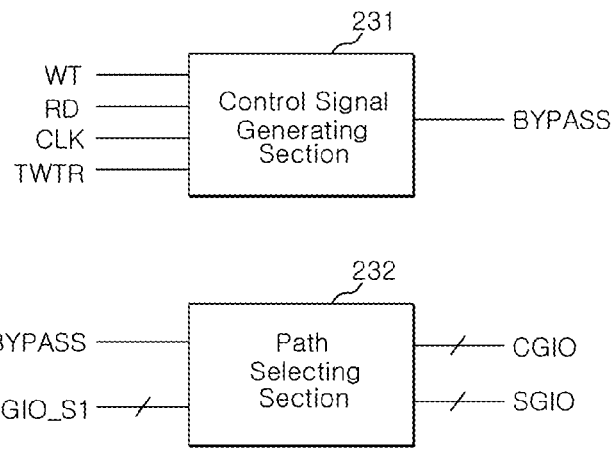
FIG. 2 is a block diagram showing a configuration of an example embodiment of a data line selection unit shown in FIG. 1.

FIG. 2 is a block diagram showing a configuration of an is example embodiment of the data line selection unit shown in FIG. 1.

Since the data line selection units 13, 23 and 33 have the same configuration, the configuration of the data line selection unit 23 of the slave chip SLAVE1 will be representatively described below with reference to FIG. 2. In FIG. 2, the data line selection unit 23 includes control signal generating section 231 and a path selecting section 232.

The control signal generating section 231 is configured to generate a path select signal BYPASS in response to the write command WT, the read command RD and an operation information signal TWTR. The operation information signal TWTR may be a signal which has information as to the predetermined time, for example, a signal which is generated in a mode register set (MRS) of a semiconductor apparatus. The control signal generating section 231 receives the information as to the predetermined time, from the operation information signal TWTR, and detects whether or not the read command RD is inputted within the predetermined time after the write command WT is inputted. The control signal generating section 231 detects a time from after the write command WT is inputted to when the read command RD is inputted, using a clock CLK. If the detected time is shorter than the predetermined time by the operation information signal TWTR, the control signal generating section 231 enables the path select signal BYPASS, and if the detected time is longer than the predetermined time by the operation information signal TWTR, the control signal generating section 231 disables the path select signal BYPASS.

The path selecting section 232 is configured to receive the data stored in the memory bank 21 and outputted through the data line GIO_S1 of the chip SLAVE1 and output the data to one of the normal data line CGIO and the auxiliary data line SGIO in response to the path select signal BYPASS in the read operation. The path selecting section 232 basically connected the data line GIO_S1 with the normal data line CGIO, and connects the data line GIO_S1 with the auxiliary data line SGIO when the path select signal BYPASS is enabled. The path selecting section 232 may be configured by a multiplexer circuit which is generally known in the art.

Figure 3:
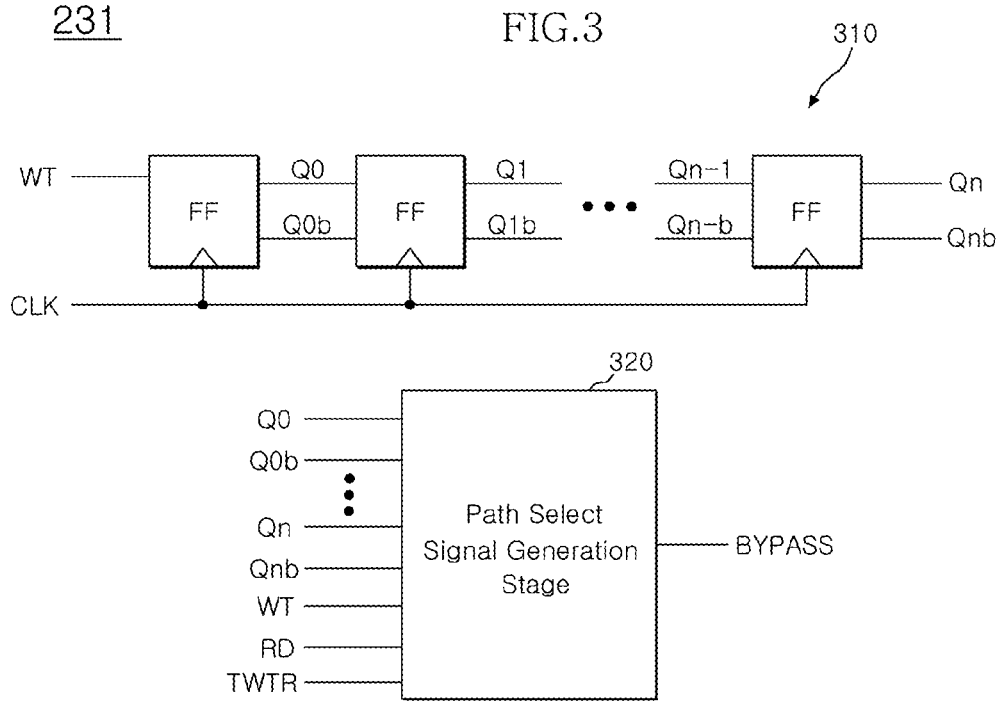
FIG. 3 is a view showing a configuration of an example is embodiment of a control signal generating section shown in FIG. 2.

FIG. 3 is a view showing the configuration of an example embodiment of the control signal generating section 231 shown in FIG. 2. In FIG. 3, the control signal generating section 231 includes a detection stage 310 and a path select signal generation stage 320. The detection stage 310 is configured to receive the write command WT and a clock signal CLK, delay the write command WT sequentially by one cycle of the clock signal CLK, and generate a plurality of output signals Q0 to Qn and Q0b to Qnb. The plurality of output signals Q0 to Qn and Q0b to Qnb have a phase difference corresponding to one cycle of the clock signal CLK. Therefore, it is possible to detect a time that has elapsed after the write command WT was inputted. The detection stage 310 may be configured to include a plurality of flip-flops FF.

The path select signal generation stage 320 is configured to receive the plurality of output signals Q0 to Qn and Q0b to Qnb generated by the detection stage 310, the write command WT, the read command RD and the operation information signal TWTR. The path select signal generation stage 320 is configured to compare the time from after the write command WT is inputted to when the read command RD is inputted, based on the output signals Q0 to Qn and Q0b to Qnb, with the predetermined time based on the operation information signal TWTR, and generate the path select signal BYPASS. For example, when the predetermined time by the operation information signal TWTR is a time that corresponds to four cycles of the clock signal CLK, operations of the path select signal generation stage 320 will be described below. If the read command RD is inputted after three cycles of the clock signal CLK have elapsed after the write command WT was inputted, the path select signal generation stage 320 enables the path select signal BYPASS. Conversely, if the read command RD is inputted after four or more cycles of the clock signal CLK have elapsed after the write command WT was inputted, the path select signal generation stage 320 disables the path select signal BYPASS.

Figure 4A:
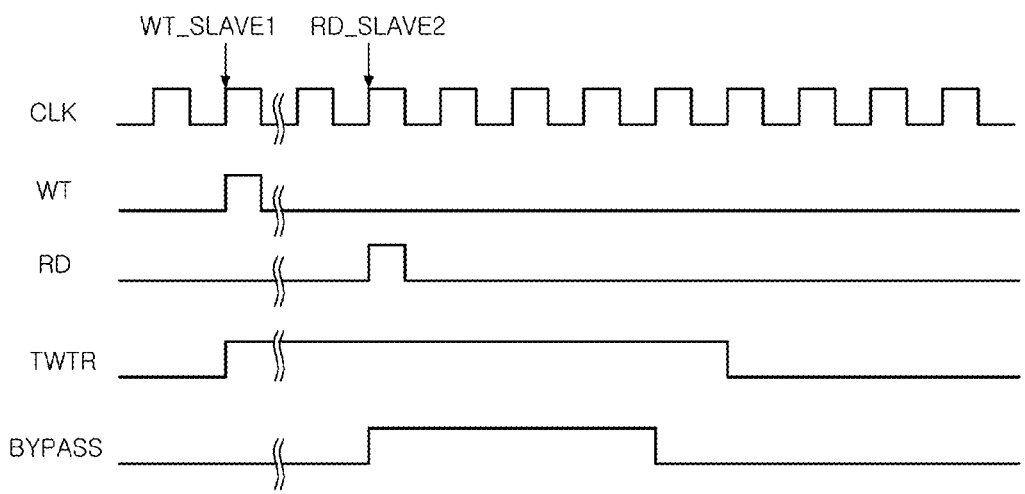
FIGS. 4a and 4b are timing diagrams explaining operations of the semiconductor apparatus in accordance with an embodiment of the present invention.
Figure 4B:
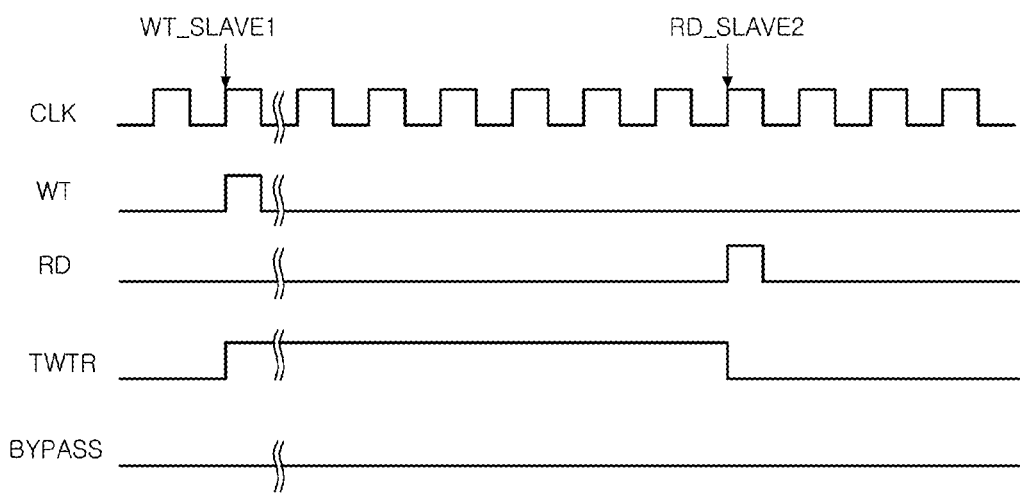

FIGS. 4a and 4b are timing diagrams explaining operations of the semiconductor apparatus 1 in accordance with an embodiment of the present invention. Operations of the semiconductor apparatus 1 in accordance with an embodiment of the present invention will be described below with reference to FIGS. 1 to 4b.

First, FIG. 4a shows a case in which a read command RD_SLAVE2 for the slave chip SLAVE2 is inputted within the is predetermined time after a write command WT_SLAVE1 for the slave chip SLAVE1 was inputted. For reference, command signals for the chips MASTER, SLAVE1 and SLAVE2 may be differentiated by a chip select signal. The chip select signal may be, for example, a command signal which is applied by the external controller. When the write command WT_SLAVE1 is inputted, the semiconductor apparatus 1 performs a write operation for the slave chip SLAVE1. The write data inputted through the data pad 15 is buffered by the data input/output unit 14 and is transmitted through the normal data line CGIO. The data transmitted through the normal data line CGIO is stored in the memory bank 21 through the data line GIO_S1 and the input/output driving unit 22 of the slave chip SLAVE1. The write operation continues for the predetermined time for storing a plurality of data. If a read command RD_SLAVE2 is inputted before the predetermined time elapses, the semiconductor apparatus 1 performs a read operation for the slave chip SLAVE2. Accordingly, the data stored in the memory bank 31 of the slave chip SLAVE2 is outputted through the input/output driving unit 32 and the data line GIO_S2. The control signal generating section 231 of slave chip SLAVE2 detects that the read command RD_SLAVE2 is inputted within the predetermined time after the write command WT_SLAVE1 is inputted, and enables the path select signal BYPASS. Accordingly, the path selecting section 232 outputs the data outputted from the memory bank 31 of the slave chip SLAVE2, to the auxiliary data line SGIO. Therefore, even when the read operation is performed within the is predetermined time, data collision does not occur, and the read data may be normally outputted to an outside through the data input/output unit 14 and the data pad 15.

FIG. 4b shows a case in which a read command RD_SLAVE2 for the slave chip SLAVE2 is inputted after the predetermined time has elapsed after a write command WT_SLAVE1 for the slave chip SLAVE1 is inputted. This case is illustrated in FIG. 4b which shows the control signal generating section 231 of the slave chip SLAVE2 detecting that the read command RD_SLAVE2 is inputted after the predetermined time has elapsed after the write command WT_SLAVE1 is inputted, and disables the path select signal BYPASS.

Accordingly, the path selecting section 232 outputs the data outputted from the memory bank 31 of the slave chip SLAVE2, to the normal data line CGIO. Because the write operation for the slave chip SLAVE1 is in a completed state, even though the data outputted from the memory bank 31 of the slave chip SLAVE2 is transmitted to the data input/output unit 14 through the normal data line CGIO, data collision does not occur.

Figure 5:
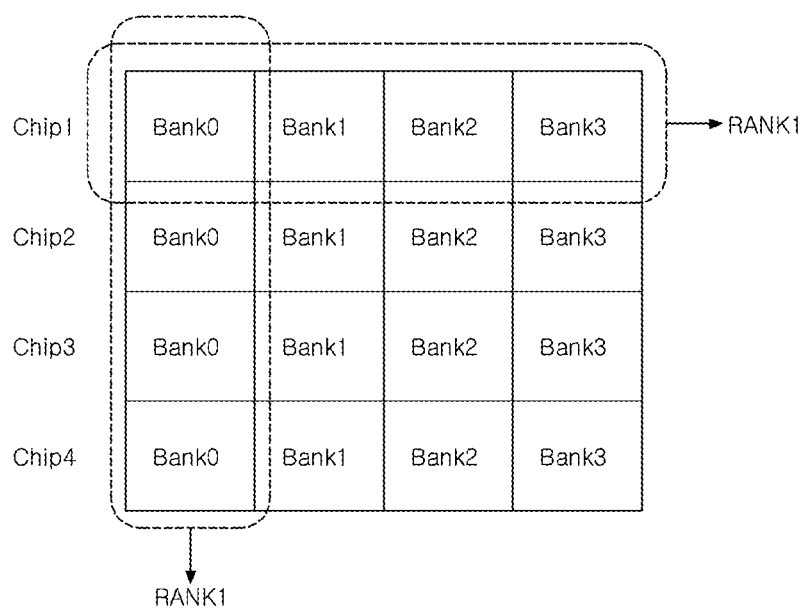
FIG. 5 is a view showing a method of dividing a plurality of chips constituting a semiconductor apparatus, into ranks.

FIG. 5 is a view conceptually showing a method of dividing a plurality of chips constituting a semiconductor apparatus, into ranks. In FIG. 5, it is exemplified that four chips are stacked and each of first to fourth chips Chip1 to Chip4 includes four memory banks Bank0 to Bank3. The method of dividing the semiconductor apparatus into ranks may be generally exemplified in two schemes. In a first scheme, the first to fourth memory banks Bank0 to Bank3 of each of the first to fourth chips Chip1 to Chip4 constitute one rank.

When, the first to fourth memory banks Bank0 to Bank3 of the first chip Chip1 constitute a first rank RANK1, the first to fourth memory banks Bank0 to Bank3 of the second chip Chip2 constitute a second rank, the first to fourth memory banks Bank0 to Bank3 of the third chip Chip3 constitute a third rank, and the first to fourth memory banks Bank0 to Bank3 of the fourth chip Chip4 constitute a fourth rank.

In a second scheme, with the first to fourth chips Chip1 to Chip4 stacked, the memory banks arranged in the same vertical line constitute one rank. In this case, the first memory banks Bank0 of the first to fourth chips Chip1 to Chip4 constitute a first rank RANK1, the second memory banks Bank1 of the first to fourth chips Chip1 to Chip4 constitute a second rank, the third memory banks Bank2 of the first to fourth chips Chip1 to Chip4 constitute a third rank, and the fourth memory banks Bank3 of the first to fourth chips Chip1 to Chip4 constitute a fourth rank.

The semiconductor apparatus 1 in accordance with the embodiment of the present invention shown in FIGS. 1 to 4b exemplifies the case of distinguishing ranks according to the first scheme. However, it is to be understood that the spirit of the present invention regarding the semiconductor apparatus 1 may be applied to the case of distinguishing ranks according to the second scheme too. That is to say, by detecting whether a read command for the second rank is inputted after a predetermined time has elapsed after a write is command for a first rank is inputted, read data may be transmitted through one of a normal data line and an auxiliary data line. That is, if the read command for the second rank is inputted after the predetermined time has elapsed, read data may be transmitted through a normal data line. If, however, the read command for the second rank is inputted within the predetermined time, read data may be transmitted through the auxiliary data line.

While certain embodiments have been described above, it will be understood to those skilled in the art that the embodiments described are by way of example only. Accordingly, the semiconductor apparatus and the data transmission method thereof described herein should not be limited based on the described embodiments. Rather, the semiconductor apparatus and the data transmission method thereof described herein should only be limited in light of the claims when taken in conjunction with the above description and accompanying drawings.

What is claimed is:

1. A semiconductor apparatus comprising:
    a normal data line connected with a data line selection unit;
    an auxiliary data line connected with the data line selection unit; and
    the data line selection unit configured to output data outputted from a memory bank to the auxiliary data line when the normal data line is transmitting any data, in response to a command signal.

2. The semiconductor apparatus according to claim 1,
    wherein the command signal includes a write command and a read command, and
    wherein the data line selection unit outputs the data to the auxiliary data line when the read command is inputted within a predetermined time after the write command is inputted.

3. The semiconductor apparatus according to claim 2, wherein the data line selection unit comprises:
    a control signal generating section configured to generate a path select signal in response to the write command, the read command and an operation information signal; and
    a path selecting section configured to output the data to one of the normal data line and the auxiliary data line in response to the path select signal.

4. The semiconductor apparatus according to claim 3, wherein the operation information signal comprises the predetermined time after which the read command may be inputted after the write command is inputted.

5. A semiconductor memory apparatus including a plurality of chips stacked upon one another, comprising:
    a normal data line shared by the plurality of chips for transmitting data;
    an auxiliary data line shared by the plurality of chips for transmitting the data; and
    data line selection units disposed in the respective chips and configured to output the data to one of the normal data line and the auxiliary data line in response to a command signal.

6. The semiconductor apparatus according to claim 5,
    wherein the command signal includes a write command and a read command, and
    wherein the data line selection units are configured to output data of a first chip to the auxiliary data line when the read command is inputted to the first chip within a predetermined time after the write command is inputted to a second chip.

7. The semiconductor apparatus according to claim 6, wherein each of the data line selection units comprises:
    a control signal generating section configured to generate a path select signal in response to the write command, the read command and an operation information signal; and
    a path selecting section configured to output the data of the first chip to one of the normal data line and the auxiliary data line in response to the path select signal.

8. The semiconductor apparatus according to claim 7, wherein the operation information signal comprises the predetermined time after which the read command may be inputted to the second chip after the write command is inputted to the second chip.

9. The semiconductor apparatus according to claim 5,
    wherein the command signal includes a write command and a read command, and the plurality of chips operate by being divided into a plurality of ranks, and
    wherein the data line selection units are configured to output data of a first rank to the auxiliary data line when the read command is inputted to the first rank within a predetermined time after the write command is inputted to a second rank.

10. The semiconductor apparatus according to claim 9, wherein each of the data line selection units comprises:
    a control signal generating section configured to generate a path select signal in response to the write command, the read command and an operation information signal; and
    a path selecting section configured to output the data of the first rank to one of the normal data line and the auxiliary data line in response to the path select signal.

11. The semiconductor apparatus according to claim 10, wherein the operation information signal comprises the predetermined time after which the read command may be inputted to the second rank after the write command is inputted to the second rank.

12. A data transmission method of a semiconductor apparatus including a first chip and a second chip which share a normal data line and an auxiliary data line, the method comprising:

transmitting write data to the first chip through the normal data line in response to a write command for the first chip;

determining whether or not a read command for the second chip is inputted within a predetermined time after the write command for the first chip is inputted; and outputting read data to one of the normal data line and the auxiliary data line depending upon a determination result.

13. The method according to claim 12, wherein, in the outputting, the read data is outputted to the auxiliary data line when the read command for the second chip is inputted within the predetermined time after the write command for the first chip is inputted, and the read data is outputted to the normal data line when the read command for the second chip is inputted after the predetermined time has elapsed after the write command for the first chip is inputted.

14. The method according to claim 12, wherein the predetermined time is a time after which the read command for the first chip may be inputted after the write command for the first chip is inputted.

15. A data transmission method of a semiconductor apparatus including a plurality of chips which operate by being divided into a plurality of ranks comprising at least a first and second rank, and share a normal data line and an auxiliary data line, the method comprising:

transmitting write data to the second rank through the normal data line in response to a write command for the second rank;

determining whether or not a read command for the first rank is inputted within a predetermined time after the write command for the second rank is inputted; and outputting read data of the first rank to one of the normal data line and the auxiliary data line depending upon a determination result.

16. The method according to claim 15, wherein, in the outputting, the read data is outputted to the auxiliary data line when the read command for the first rank is inputted within the predetermined time after the write command for the second rank is inputted, and the read data is outputted to the normal data line when the read command for the first rank is inputted after the predetermined time has elapsed after the write command for the second rank is inputted.

17. The method according to claim 15, wherein the predetermined time is a time after which the read command for the second rank may be inputted after the write command for the second rank is inputted.

* * * * *